United States Patent
Pietraski et al.

(10) Patent No.: US 8,028,217 B2
(45) Date of Patent: Sep. 27, 2011

(54) METHOD AND APPARATUS FOR ENCODING AND DECODING HIGH SPEED SHARED CONTROL CHANNEL

(75) Inventors: Philip J. Pietraski, Huntington Station, NY (US); Yongwen Yang, Hillsborough, NJ (US)

(73) Assignee: InterDigital Technology Corporation, Wilmington, DE (US)

( * ) Notice: Subject to any disclaimer, the term of this patent is extended or adjusted under 35 U.S.C. 154(b) by 1001 days.

(21) Appl. No.: 11/928,390

(22) Filed: Oct. 30, 2007

(65) Prior Publication Data
US 2008/0104475 A1 May 1, 2008

Related U.S. Application Data

(60) Provisional application No. 60/863,428, filed on Oct. 30, 2006, provisional application No. 60/863,473, filed on Oct. 30, 2006.

(51) Int. Cl.
*H03M 13/00* (2006.01)
(52) U.S. Cl. ........................... 714/758; 714/752
(58) Field of Classification Search .................. 714/752, 714/758
See application file for complete search history.

(56) References Cited

U.S. PATENT DOCUMENTS

| | | | |
|---|---|---|---|
| 2003/0147371 A1* | 8/2003 | Choi et al. | 370/341 |
| 2003/0185242 A1* | 10/2003 | Lee et al. | 370/491 |
| 2004/0058687 A1* | 3/2004 | Kim et al. | 455/452.2 |
| 2005/0013263 A1* | 1/2005 | Kim et al. | 370/320 |
| 2005/0100038 A1 | 5/2005 | Pietraski et al. | |
| 2011/0096765 A1* | 4/2011 | Chappaz | 370/342 |

FOREIGN PATENT DOCUMENTS

GB 2387303 10/2003

OTHER PUBLICATIONS

3$^{rd}$ Generation Partnership Project; Technical Specification Group Radio Access Network; Multiplexing and channel coding (FDD) (Release 7); 3GPP TS 25.212 V7.2.0 (Sep. 2006).
3$^{rd}$ Generation Partnership Project; Technical Specification Group Radio Access Network; Multiplexing and channel coding (FDD) (Release 7); 3GPP TS 25.212 V7.6.0 (Sep. 2007).
European Telecommunications Standards Institute, "Universal Mobile Telecommunications System (UMTS); Multiplexing and channel coding (FDD) (3GPP TS 25.212 V6.7.0 Release 6)," ETSI TS 125 212 V 6.7.0, XP014032560 (Dec. 2005).

* cited by examiner

*Primary Examiner* — Sam Rizk
(74) *Attorney, Agent, or Firm* — Volpe and Koenig, P.C.

(57) ABSTRACT

A method and apparatus for encoding and decoding high speed shared control channel (HS-SCCH) data are disclosed. For part 1 data encoding, a mask may be generated using a wireless transmit/receive unit (WTRU) identity (ID) and a generator matrix with a maximum minimum Hamming distance. For part 2 data encoding, cyclic redundancy check (CRC) bits are generated based on part 1 data and part 2 data. The number of CRC bits is less than the WTRU ID. The CRC bits and/or the part 2 data are masked with a mask. The mask may be a WTRU ID or a punctured WTRU ID of length equal to the CRC bits. The mask may be generated using the WTRU ID and a generator matrix with a maximum minimum Hamming distance. The masking may be performed after encoding or rate matching.

28 Claims, 3 Drawing Sheets

METHOD AND APPARATUS FOR ENCODING AND DECODING HIGH SPEED SHARED CONTROL CHANNEL

CROSS REFERENCE TO RELATED APPLICATION

This application claims the benefit of U.S. provisional application Nos. 60/863,428 filed Oct. 30, 2006 and 60/863,473 filed Oct. 30, 2006, which is incorporated by reference as if fully set forth.

FIELD OF INVENTION

The present invention is related to wireless communication.

BACKGROUND

In third generation partnership project (3GPP) high speed downlink packet access (HSPDA), control information that is necessary for decoding high speed downlink shared channel (HS-DSCH) is transmitted via a high speed shared control channel (HS-SCCH). Multiple HS-SCCHs may be transmitted to a set of wireless transmit/receive units (WTRUs) associated with a particular cell. The HS-SCCH carries two (2) parts of data: part 1 data and part 2 data. The part 1 data includes channelization code set information, modulation scheme information, etc. The part 2 data includes transport block size information, hybrid automatic repeat request (HARQ) process information, redundancy and constellation version information, WTRU identity (ID), etc. An HS-SCCH frame includes three time slots. The part 1 data is transmitted in the first time slot, and the part 2 data is transmitted in the second and third time slots.

FIG. 1 shows conventional HS-SCCH encoding. For encoding the part 1 data, the channelization code set information $X_{ccs}$ and modulation scheme information $X_{ms}$ are multiplexed to generate a sequence of bits $X_1$. Rate ⅓ convolutional coding is applied to the sequence of bits $X_1$ to generate a sequence of bits $Z_1$. The sequence of bits $Z_1$ is punctured for rate matching to generate a sequence of bits $R_1$. The rate matched bits $R_1$ are masked in a WTRU-specific way using the WTRU ID to produce a sequence of bits $S_1$. Masking in this context means that each bit is conditionally flipped depending on the mask bit value. For the WTRU specific masking, intermediate code word bits are generated by encoding the WTRU ID using the rate ½ convolutional coding.

For encoding the part 2 data, the transport block size information $X_{tbs}$, HARQ process information $X_{hap}$, redundancy version information $X_{rv}$, and new data indicator $X_{nd}$ are multiplexed to generate a sequence of bits $X_2$. From the sequence of bits $X_1$ and $X_2$, cyclic redundancy check (CRC) bits are calculated. The CRC bits are masked with the WTRU ID, ($X_{ue}$), and then appended to the sequence of bits $X_2$ to form a sequence of bits Y. Rate ⅓ convolutional coding is applied to the sequence of bits Y to generate a sequence of bits $Z_2$. The sequence of bits $Z_2$ is punctured for rate matching to generate a sequence of bits $R_2$. The sequences of bits S1 and R2 are combined and mapped to the physical channel for transmission.

The performance of the detection of the part 1 data is influenced by the Hamming distance between the masks used for multiple HS-SCCHs. The conventional method produces a set of masks with a minimum distance of eight (8). When these minimum distance codes are used, the HS-SCCH detection performance is not optimal. In addition, with implementation of multiple-input multiple-output (MIMO) for HSDPA, more data need to be carried by the HS-SCCH. Therefore, it is necessary to make more room for transmission of data related to MIMO implementation in the HS-SCCH.

SUMMARY

A method and apparatus for encoding and decoding HS-SCCH data are disclosed. For part 1 data encoding, a mask may be generated using a WTRU ID and a generator matrix with a maximum minimum Hamming distance. For part 2 data encoding, CRC bits are generated based on part 1 data and part 2 data. The number of CRC bits may be less than the WTRU ID. The CRC bits and/or the part 2 data are masked with a mask. The mask may be a WTRU ID or a punctured WTRU ID of length equal to the CRC bits. The mask may be generated using the WTRU ID and a generator matrix with a maximum minimum Hamming distance. The masking may be performed after encoding or rate matching.

BRIEF DESCRIPTION OF THE DRAWINGS

A more detailed understanding of the invention may be had from the following description, given by way of example and to be understood in conjunction with the accompanying drawings wherein.

DETAILED DESCRIPTION

When referred to hereafter, the terminology "WTRU" includes but is not limited to a user equipment (UE), a mobile station, a fixed or mobile subscriber unit, a pager, a cellular telephone, a personal digital assistant (PDA), a computer, or any other type of user device capable of operating in a wireless environment. When referred to hereafter, the terminology "Node-B" includes but is not limited to a base station, a site controller, an access point (AP), or any other type of interfacing device capable of operating in a wireless environment.

Figure 1:
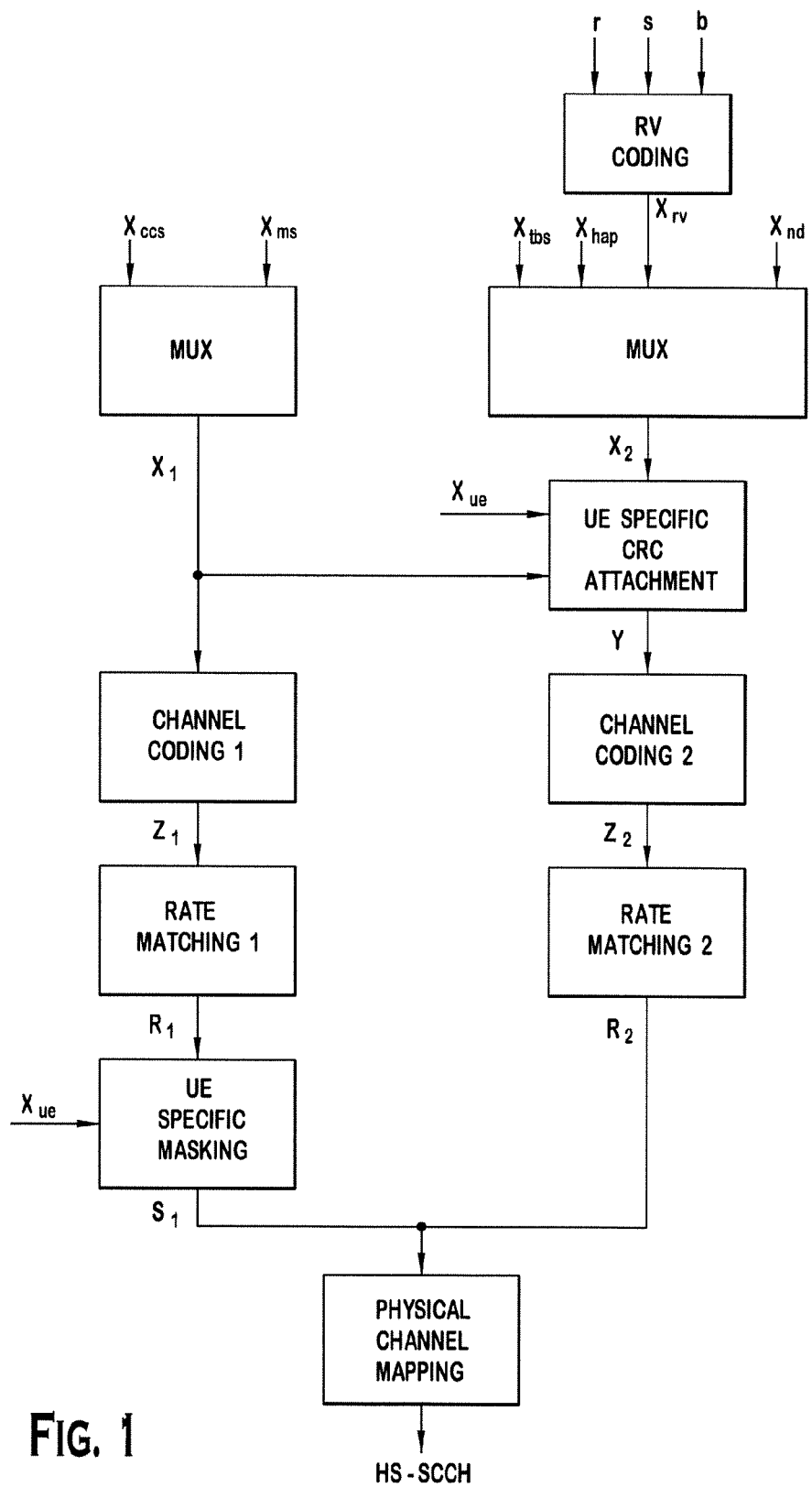
FIG. 1 shows conventional HS-SCCH encoding.
Figure 2:
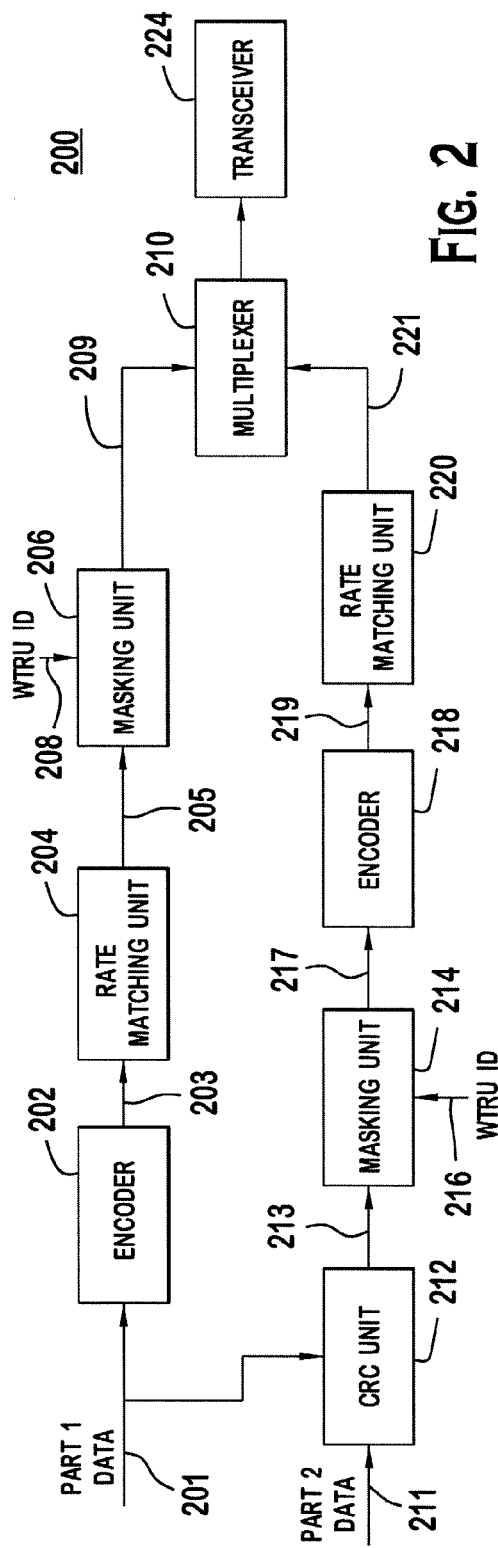
FIG. 2 is a block diagram of an example Node-B for encoding HS-SCCH data.

FIG. 2 is a block diagram of an example Node-B 200 for encoding HS-SCCH data. The Node-B 200 comprises an encoder 201, a rate matching unit 204, a masking unit 206, a multiplexer 210, a CRC unit 212, a masking unit 214, an encoder 218, a rate matching unit 220, and a transceiver 224. The HS-SCCH data comprises part 1 data and part 2 data. The part 1 data is sent to the encoder 202. The encoder 202 performs channel coding on the part 1 data 201. The channel coded part 1 data 203 is then punctured by the rate matching unit 204 for rate matching. The rate matched part 1 data 205 is then masked with a mask by the masking unit 206. The mask may be generated based on the WTRU ID 208.

Codes are usually selected for both their performance and for the simplicity of the decoders. Convolutional codes are a good example of codes that have both good performance and low decoder complexity. There is of course some tradeoff between performance and decoder complexity. However, the decoder complexity is not a factor when selecting a code to use for the masking because the corresponding decoder need not exist in the WTRU. All that is needed is the mask itself which can be created by the much simpler encoder.

The masking unit 206 generates the mask by block coding the WTRU ID 208 with a generator matrix which produces masks with a maximum minimum-Hamming-distance. The mask is generated by a vector-matrix product of the WTRU ID and the generator matrix. The resulting mask is a linear combination of the rows of the generator matrix. An example generator matrix for (40,16) code is given below. It should be noted that the generator matrix shown below is provided as an example, not as a limitation, and any other generator matrix may be used alternatively. In this example, the mask is the 40-bit mask, and the WTRU ID is 16-bits long. This example uses a block code with a specified generator matrix which produces masks with minimum distance of twelve (12). This provides much better performance when multiple HS-SCCH transmissions at the minimum distance are used.

```
[1 0 0 0 0 0 0 0 0 0 0 0 0 0 0 0 1 0 1 0 1 0 0 1 0 0 1 1 1 0 0 1 0 0 1 1 1 0]
[0 1 0 0 0 0 0 0 0 0 0 0 0 0 0 0 1 0 0 1 1 0 0 1 0 1 0 1 0 0 0 1 1 1 0 0 1 0 0 1]
[0 0 1 0 0 0 0 0 0 0 0 0 0 0 0 0 1 0 0 1 1 0 0 1 0 1 0 1 0 0 0 0 1 1 1 0 0 1 0 1]
[0 0 0 1 0 0 0 0 0 0 0 0 0 0 0 0 1 0 0 1 1 0 0 1 0 1 0 1 0 0 0 1 1 1 0 0 1 1]
[0 0 0 0 1 0 0 0 0 0 0 0 0 0 0 0 1 0 0 1 1 1 1 1 0 1 0 1 1 1 0 0 1 1 0 1 0 1 1 0]
[0 0 0 0 0 1 0 0 0 0 0 0 0 0 0 0 1 1 0 0 0 0 1 1 1 1 0 1 1 0 0 0 1 0 0 0 0 1 0 1]
[0 0 0 0 0 0 1 0 0 0 0 0 0 0 0 0 1 1 0 0 0 0 1 1 1 1 0 1 1 0 0 0 1 0 0 0 0 0 1 1]
[0 0 0 0 0 0 0 1 0 0 0 0 0 0 0 0 1 0 1 1 1 1 1 0 1 0 0 0 0 0 0 1 1 0 0 1 1 1 0]
[0 0 0 0 0 0 0 0 1 0 0 0 0 0 0 0 1 1 0 1 0 1 0 0 0 1 1 0 1 1 0 1 0 0 0 1 0 0 1]
[0 0 0 0 0 0 0 0 0 1 0 0 0 0 0 0 1 1 0 1 0 0 1 0 0 0 1 1 0 1 1 0 1 0 0 0 1 0 1]
[0 0 0 0 0 0 0 0 0 0 1 0 0 0 0 0 1 1 0 1 0 0 1 0 0 0 1 1 0 1 1 0 1 0 0 0 1 1]
[0 0 0 0 0 0 0 0 0 0 0 1 0 0 0 0 1 0 0 1 0 1 1 0 0 1 1 0 0 0 0 0 0 0 1 1 1 1 0]
[0 0 0 0 0 0 0 0 0 0 0 0 1 0 0 0 1 0 0 1 1 0 0 1 1 1 0 1 1 0 1 1 1 0 1 1 1 1 0 1]
[0 0 0 0 0 0 0 0 0 0 0 0 0 1 0 0 0 1 1 0 0 0 1 1 1 0 1 1 0 1 1 1 0 1 1 1 1 0 0 1]
[0 0 0 0 0 0 0 0 0 0 0 0 0 0 1 0 0 0 1 1 0 0 0 1 1 1 0 1 1 0 1 1 1 0 1 1 1 1 0 1]
[0 0 0 0 0 0 0 0 0 0 0 0 0 0 0 1 0 0 0 1 1 0 0 0 1 1 1 0 1 1 0 1 1. 1 0 1 1 1 1 1]
```

Figure 4:
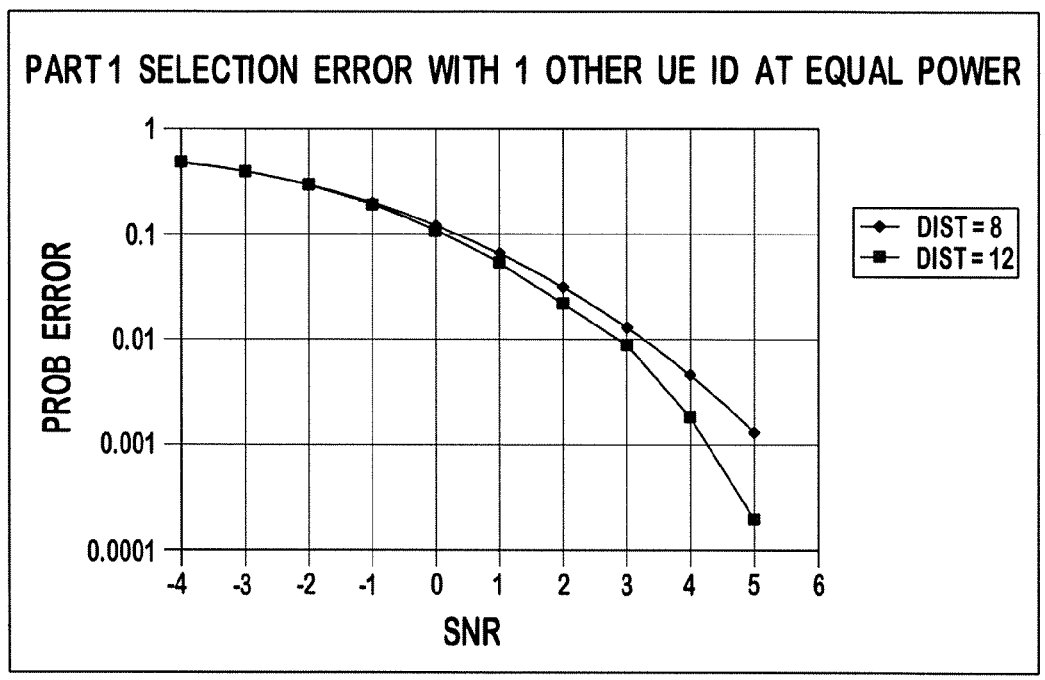
FIG. 4 shows simulation results for the selection error probability of the part 1 data v. signal-to-noise ratio (SNR) comparing the performance of the two HS-SCCH masking methods (prior art and the present invention) where two HS-SCCH codes are transmitted with different mask distances dictated the corresponding methods.

Conventionally, the mask is generated by encoding the WTRU ID 208 using the rate ½ convolutional coding. The minimum Hamming distance of the conventional masks is eight (8). The improved Hamming distance of the masks generated by the present invention results in a performance improvement of the part 1 HS-SCCH decoder at the WTRU. FIG. 4 shows simulation results for the selection error probability of the part 1 data v. SNR comparing the performance of the two HS-SCCH masking methods (prior art and the present invention) where two HS-SCCH codes are transmitted with different mask distances dictated the corresponding methods. FIG. 4 shows performance improvement when using the mask with the Hamming distance of twelve (12) compared to the mask with the Hamming distance of eight (8).

Referring again to FIG. 2, the part 1 data 201 and the part 2 data 211 are sent to the CRC unit 212 to calculate CRC bits. The CRC bits are attached to the part 2 data 211. The number of CRC bits may be less than the length of the WTRU ID so that more data, (e.g., data for MIMO), may be included as the part 2 data. The combined part 2 data and the CRC bits 213 are sent to the masking unit 214. The masking unit 214 performs masking to the CRC bits or CRC bits plus some or all of the part 2 data with a mask, which will be explained in detail below. The masked part 2 data and CRC bits 217 are encoded by the encoder 218. The encoded part 2 data and CRC bits 219 are punctured by the rate matching unit 220. The rate matched part 2 data and CRC bits 221 and the rate matched part 1 data 209 are multiplexed by the multiplexer 210 and sent to the transceiver 224 for transmission.

In accordance with one embodiment, the masking unit 214 may generate a mask having a size equal to or smaller than the size of the CRC bits plus the part 2 data. A portion of the mask is extracted and applied to the CRC bits and the remaining portion of the mask is applied to all or part of the part 2 data. The mask may be generated using the WTRU ID 216 and a generator matrix as disclosed above with respect to part 1 data masking to maximize the minimum Hamming distance of the masks.

In accordance with another embodiment, the WTRU ID may be used as a mask. The length of the WTRU ID may be longer than the CRC bits. Therefore, a part of the WTRU ID is used to mask the CRC bits and the remaining of the WTRU ID is used to mask the part 2 data. In accordance with yet another embodiment, the WTRU ID is punctured to be the same length as the CRC bits and the punctured WTRU ID is used to mask the CRC bits.

In accordance with still another embodiment, the masking unit 214 may be moved between the encoder and the rate matching unit. The masking unit 214 generates a mask of length equal to the rate matched part 2 data and CRC bits 221. The masking unit 214 then applies the mask to the encoded part 2 data and CRC bits 219. Alternatively, the masking unit 214 may be moved between the rate matching unit 220 and the multiplexer 210, and applies the mask to the rate matched part 2 data and CRC bits 221. The mask may be 80-bits long. The mask may be generated using the WTRU ID 216 and a generator matrix as disclosed above with respect to part 1 data masking to maximize the minimum Hamming distance of the masks.

Figure 3:
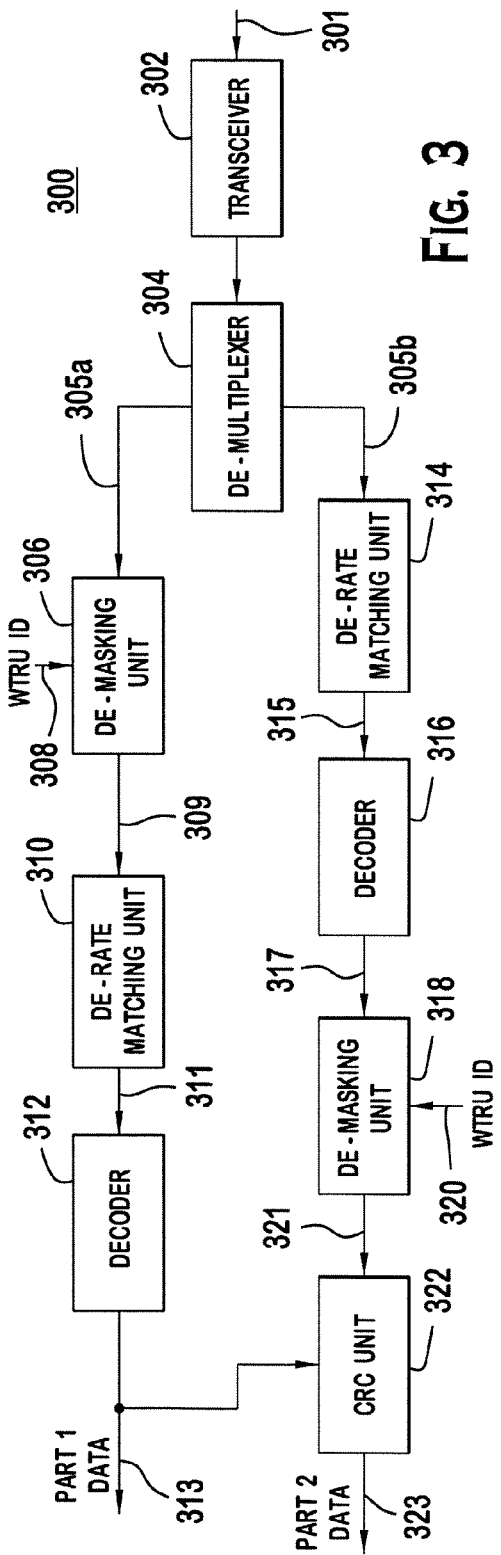
FIG. 3 is a block diagram of an example WTRU for decoding HS-SCCH data.

FIG. 3 is a block diagram of an example WTRU 300 for decoding HS-SCCH data. The WTRU 300 includes a transceiver 302, a de-multiplexer 304, a de-masking unit 306, a de-rate matching unit 310, a decoder 312, a de-rate matching unit 314, a decoder 316, a de-masking unit 318, and a CRC unit 322. The transceiver 302 receives a HS-SCCH transmission 301 including a first part on a first time slot of an HS-SCCH frame corresponding to the part 1 data and a second part on the second and third time slots of the HS-SCCH frame corresponding to the part 2 data. The first part 305*a* and the second part 305*b* are de-multiplexed by the de-multiplexer 304.

The first part 305*a* is de-masked by the de-masking unit 306. The de-masking unit 306 generates the same mask used at the Node-B in the same way using the WTRU ID 308. The mask may be generated with the WTRU ID 308 and the generator matrix as disclosed above. The de-rate matching unit 310 reverts the puncturing performed at the Node-B on the de-masked first part 309. The de-rate matched first part 311 is then decoded by the decoder 312 to output part 1 data 313. The part 1 data is also sent to the CRC unit 322.

The second part 305*b* is de-rate matched by the de-rate matching unit 314 to revert the puncturing performed at the Node-B. The de-rate matched second part 315 is then decoded by the decoder 316 to output part 2 data (may or may not be masked at the NodeB) and masked CRC bits 317. The masked CRC bits and optionally the masked part 2 data 317 are de-masked by the de-masking unit 318. The de-masking unit 318 uses the same mask used at the Node-B for the de-masking. The mask may be the WTRU ID 320, punctured WTRU ID, or a mask generated by using the WTRU ID 320 and a generator matrix. The de-masking unit 318 outputs de-masked part 2 data and CRC bits 321 to the CRC unit 322. The CRC unit 322 then performs a CRC check with the part 1 data 313, the part 2 data, and CRC bits.

The de-masking unit 318 may be moved between the decoder 316 and the de-rate matching unit 314, or between the de-rate matching unit 314 and the de-multiplexer 304 depending on the masking scheme performed at the Node-B. In this case, the mask may be 80-bits long, and the mask may be generated using the WTRU ID 216 and a generator matrix as stated above to maximize the minimum Hamming distance of the masks.

Although the features and elements of the present invention are described in particular combinations, each feature or element can be used alone without the other features and elements or in various combinations with or without other features and elements. The methods or flow charts provided may be implemented in a computer program, software, or firmware tangibly embodied in a computer-readable storage medium for execution by a general purpose computer or a processor. Examples of computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine.

A processor in association with software may be used to implement a radio frequency transceiver for use in a WTRU, user equipment (UE), terminal, base station, radio network controller (RNC), or any host computer. The WTRU may be used in conjunction with modules, implemented in hardware and/or software, such as a camera, a video camera module, a videophone, a speakerphone, a vibration device, a speaker, a microphone, a television transceiver, a hands free headset, a keyboard, a Bluetooth® module, a frequency modulated (FM) radio unit, a liquid crystal display (LCD) display unit, an organic light-emitting diode (OLED) display unit, a digital music player, a media player, a video game player module, an Internet browser, and/or any wireless local area network (WLAN) module.

What is claimed is:

1. A Node-B for encoding high speed shared control channel (HS-SCCH) part 2 data, the Node-B comprising:
   a cyclic redundancy check (CRC) unit for generating CRC bits based on part 1 data and part 2 data, the CRC bits being attached to the part 2 data, the number of CRC bits being less than a wireless transmit/receive unit (WTRU) identity (ID);
   a masking unit for performing WTRU-specific masking with a mask on at least one of the part 2 data and the CRC bits; and
   a transmitter for transmitting the part 1 data and the part 2 data with the attached CRC bits after the WTRU-specific masking.

2. The Node-B of claim 1 wherein the mask is a punctured WTRU ID of length equal to the CRC bits.

3. The Node-B of claim 1 wherein the mask is the WTRU ID, and a portion of the WTRU ID is used to mask the CRC bits and the remainder of the WTRU ID is used to mask the part 2 data.

4. The Node-B of claim 1 wherein the masking unit generates maximum minimum-Hamming-distance masks using the WTRU ID and a generator matrix.

5. The Node-B of claim 1 further comprising:
   a channel encoder for performing channel coding on the part 2 data and the CRC bits; and
   a rate matching unit for performing rate matching on the encoded part 2 data and CRC bits, wherein the masking unit generates the mask of length equal to the rate matched encoded part 2 data and CRC bits, and performs the WTRU-specific masking after one of the channel coding and the rate matching.

6. A wireless transmit/receive unit (WTRU) for decoding high speed shared control channel (HS-SCCH) part 2 data, the WTRU comprising:
   a receiver for receiving part 1 data and part 2 data with attached cyclic redundancy check (CRC) bits on an HS-SCCH, the number of CRC bits being less than a WTRU identity (ID), at least one of the part 2 data and the CRC bits being masked with a mask;
   a de-masking unit for performing de-masking with the mask on at least one of the received part 2 data and the received CRC bits; and
   a CRC unit for performing a CRC check with the de-masked CRC bits, the part 1 data, and the part 2 data.

7. The WTRU of claim 6 wherein at least one of the received part 2 data and the received CRC bits are de-masked with a punctured WTRU ID of length equal to the CRC bits.

8. The WTRU of claim 6 wherein the received CRC bits are de-masked with a portion of the WTRU ID and the received part 2 data is de-masked with the remainder of the WTRU ID.

9. The WTRU of claim 6 wherein the de-masking unit generates maximum-Hamming-distance masks using the WTRU ID and a generator matrix.

10. The WTRU of claim 6 further comprising:
    a rate de-matching unit for performing rate de-matching on the received part 2 data and the received CRC bits; and
    a channel decoder for performing channel decoding on the received part 2 data and the received CRC bits after the rate de-matching,
    wherein the length of the mask is equal to rate matched encoded part 2 data and CRC bits, and the de-masking unit performs the de-masking before one of the channel decoding and the rate de-matching.

11. A method for encoding high speed shared control channel (HS-SCCH) part 2 data, the method comprising:
    generating cyclic redundancy check (CRC) bits based on part 1 data and part 2 data, the CRC bits being attached to the part 2 data, the number of CRC bits being less than a wireless transmit/receive unit (WTRU) identity (ID);
    performing WTRU-specific masking with a mask on at least one of the part 2 data and the CRC bits; and
    transmitting the part 1 data and the part 2 data with the attached CRC bits after the WTRU-specific masking.

12. The method of claim 11 wherein the mask is a punctured WTRU ID of length equal to the CRC bits.

13. The method of claim 11 wherein the mask is the WTRU ID, and a portion of the WTRU ID is used to mask the CRC bits and the remainder of the WTRU ID is used to mask the part 2 data.

14. The method of claim 11 further comprising:
    generating a maximum minimum-Hamming-distance mask using the WTRU ID and a generator matrix.

15. The method of claim 11 further comprising:
    performing channel coding on the part 2 data and the CRC bits;
    performing rate matching on the encoded part 2 data and CRC bits; and
    generating the mask, the length of the mask being equal to the rate matched encoded part 2 data and CRC bits, wherein the WTRU-specific masking is performed after one of the channel coding and the rate matching.

16. A method for decoding high speed shared control channel (HS-SCCH) part 2 data, the method comprising:
receiving part 1 data and part 2 data with attached cyclic redundancy check (CRC) bits on an HS-SCCH, the number of CRC bits being less than a wireless transmit/receive unit (WTRU) identity (ID), at least one of the part 2 data and the CRC bits being masked with a mask;
performing de-masking with the mask on at least one of the received part 2 data and the received CRC bits; and
performing a CRC check with the de-masked CRC bits, the part 1 data, and the part 2 data.

17. The method of claim 16 wherein at least one of the received part 2 data and the received CRC bits are de-masked with a punctured WTRU ID of length equal to the CRC bits.

18. The method of claim 16 wherein the received CRC bits are de-masked with a portion of the WTRU ID and the received part 2 data is de-masked with the remainder of the WTRU ID.

19. The method of claim 16 further comprising:
generating a maximum minimum-Hamming-distance mask using the WTRU ID and a generator matrix.

20. The method of claim 16 further comprising:
generating the mask;
performing rate de-matching on the received part 2 data and the received CRC bits; and
performing channel decoding on the received part 2 data and the received CRC bits after the rate de-matching,
wherein the length of the mask is equal to rate matched encoded part 2 data and CRC bits, and the de-masking unit performs the de-masking before one of the channel decoding and the rate de-matching.

21. A Node-B for encoding high speed shared control channel (HS-SCCH) part 1 data, the Node-B comprising:
a channel encoder for performing channel coding on part 1 data;
a rate matching unit for performing rate matching on the encoded part 1 data;
a masking unit for generating a maximum minimum-Hamming-distance mask using a wireless transmit/receive unit (WTRU) identity (ID) and a generator matrix, and performing masking with the mask on the rate matched encoded part 1 data; and
a transmitter for transmitting the masked part 1 data.

22. The Node-B of claim 21 wherein the mask is generated by (40, 16) coding on sixteen (16) bit WTRU ID and the masks have a minimum distance of twelve (12).

23. A wireless transmit/receive unit (WTRU) for decoding high speed shared control channel (HS-SCCH) part 1 data, the WTRU comprising:
a receiver for receiving part 1 data;
a de-masking unit for generating a maximum minimum-Hamming-distance mask using a WTRU identity (ID) and a generator matrix and performing de-masking with the mask on the received part 1 data;
a rate de-matching unit for performing rate de-matching on the de-masked part 1 data; and
a channel decoder for performing channel decoding on the rate de-matched part 1 data.

24. The WTRU of claim 23 wherein the mask is generated by (40, 16) coding on sixteen (16) bit WTRU ID and the masks have a minimum distance of twelve (12).

25. A method for encoding high speed shared control channel (HS-SCCH) part 1 data, the method comprising:
performing channel coding on part 1 data;
performing rate matching on the encoded part 1 data;
generating a maximum minimum-Hamming-distance mask using a wireless transmit/receive unit (WTRU) identity (ID) and a generator matrix;
performing masking of the rate matched encoded part 1 data with the mask; and
transmitting the masked part 1 data.

26. The method of claim 25 wherein the mask is generated by (40, 16) coding on sixteen (16) bit WTRU ID and the masks have a minimum distance of twelve (12).

27. A method for decoding high speed shared control channel (HS-SCCH) part 1 data, the method comprising:
receiving part 1 data;
generating a maximum minimum-Hamming-distance mask using a WTRU identity (ID) and a generator matrix;
performing de-masking of the received part 1 data with the mask;
performing rate de-matching on the de-masked part 1 data; and
performing channel decoding on the rate de-matched part 1 data.

28. The method of claim 27 wherein the mask is generated by (40, 16) coding on sixteen (16) bit WTRU ID and the masks have a minimum distance of twelve (12).

* * * * *